United States Patent
Senda

(10) Patent No.: US 10,601,416 B2
(45) Date of Patent: Mar. 24, 2020

(54) GATE DRIVE DEVICE

(71) Applicant: DENSO CORPORATION, Kariya, Aichi-pref. (JP)

(72) Inventor: Yasutaka Senda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/389,026

(22) Filed: Apr. 19, 2019

(65) Prior Publication Data

US 2019/0245536 A1    Aug. 8, 2019

Related U.S. Application Data

(63) Continuation of application No. PCT/JP2017/036988, filed on Oct. 12, 2017.

(30) Foreign Application Priority Data

Nov. 25, 2016 (JP) ................. 2016-228961

(51) Int. Cl.
| | | |
|---|---|---|
| H03K 3/01 | (2006.01) | |
| H03K 17/567 | (2006.01) | |
| H03K 17/687 | (2006.01) | |
| H03K 17/16 | (2006.01) | |
| H02M 1/08 | (2006.01) | |
| H03K 17/12 | (2006.01) | |

(52) U.S. Cl.
CPC ............ *H03K 17/567* (2013.01); *H02M 1/08* (2013.01); *H03K 17/127* (2013.01); *H03K 17/168* (2013.01); *H03K 17/6877* (2013.01)

(58) Field of Classification Search
CPC ...... H03K 17/567; H03K 17/06; H03K 17/56; H03K 17/687; H02M 1/08
See application file for complete search history.

(56) References Cited

U.S. PATENT DOCUMENTS

| | | | | |
|---|---|---|---|---|
| 6,097,159 | A * | 8/2000 | Mogi ...................... | H01S 5/042 315/149 |
| 6,879,608 | B1 * | 4/2005 | Schuelke ................ | H01S 5/042 372/38.02 |
| 7,158,766 | B2 * | 1/2007 | Imayama ................. | H04B 1/30 455/130 |
| 8,958,445 | B2 * | 2/2015 | Kubo .................... | H01S 5/0428 372/29.012 |
| 2015/0180453 | A1 | 6/2015 | Mori | |

* cited by examiner

*Primary Examiner* — Dinh T Le
(74) *Attorney, Agent, or Firm* — Posz Law Group, PLC

(57) ABSTRACT

A gate drive device for driving a plurality of semiconductor devices connected in parallel to each other includes a constant current circuit, a plurality of switching element, and a drive controller. The constant current circuit supplies a constant current to respective gates of the plurality of semiconductor devices. The plurality of switching elements is respectively provided on a plurality of paths that connects the constant current circuit and the respective gates of the plurality of semiconductor devices. The drive controller controls driving of the plurality of switching elements to supply the constant current from the constant current circuit to the respective gates of the plurality of semiconductor devices.

6 Claims, 9 Drawing Sheets

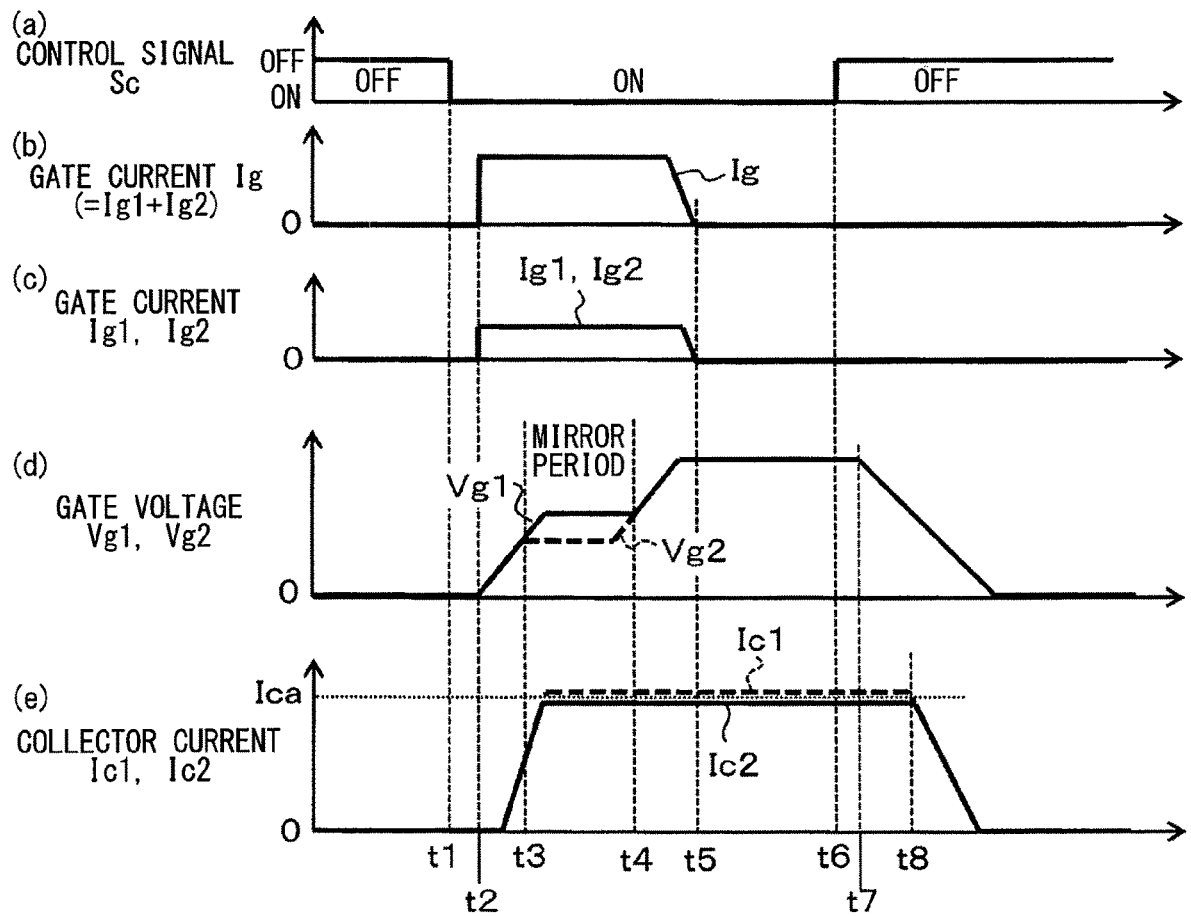
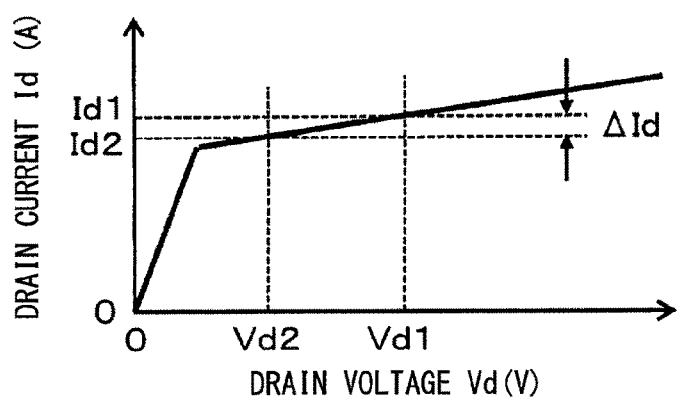

$$Id = \frac{1}{2}\beta \cdot \frac{W}{L} \cdot (Vg-Vt)^2 \cdot (1+\lambda Vd) \quad \cdots (1)$$

$$= K \cdot (1+\lambda Vd) \quad \cdots (2)$$

$$K = \frac{1}{2}\beta \cdot \frac{W}{L} \cdot (Vg-Vt)^2 \quad \cdots (3)$$

$$\beta = \mu \cdot Co \quad \cdots (4)$$

$$\Delta Id = Id1 - Id2 \quad \cdots (5)$$

$$= K \cdot (1+\lambda Vd1) - K \cdot (1+\lambda Vd2)$$

$$= K \cdot \lambda \cdot (Vd1 - Vd2) \quad \cdots (6)$$

GATE DRIVE DEVICE

CROSS REFERENCE TO RELATED APPLICATIONS

The present application is a continuation application of International Patent Application No. PCT/JP2017/036988 filed on Oct. 12, 2017, which designated the U.S. and claims the benefit of priority from Japanese Patent Application No. 2016-228961 filed on Nov. 25, 2016. The entire disclosures of all of the above applications are incorporated herein by reference.

TECHNICAL FIELD

The present disclosure relates to a gate drive device.

BACKGROUND

There has been a gate drive device that controls driving of multiple gate-driven type semiconductor devices connected in parallel to each other to supply a large current to a load.

SUMMARY

The present disclosure provides a gate drive device for driving multiple semiconductor devices connected in parallel to each other. The gate drive device includes a constant current circuit that supplies a constant current to respective gates of the semiconductor devices, multiple switching elements that is respectively provided on multiple paths connecting the constant current circuit and the respective gates of the semiconductor devices, and a drive controller that controls driving of the switching elements to supply the constant current from the constant current circuit to the respective gates of the semiconductor devices.

BRIEF DESCRIPTION OF DRAWINGS

The above and other objects, features and advantages of the present disclosure will become more apparent from the following detailed description made with reference to the accompanying drawings. In the drawings:

FIG. 3 is a time chart of gate currents, gate voltages, and collector currents in response to a control signal;

FIG. 4 is a diagram illustrating an operation principle;

DETAILED DESCRIPTION

Figure 1:
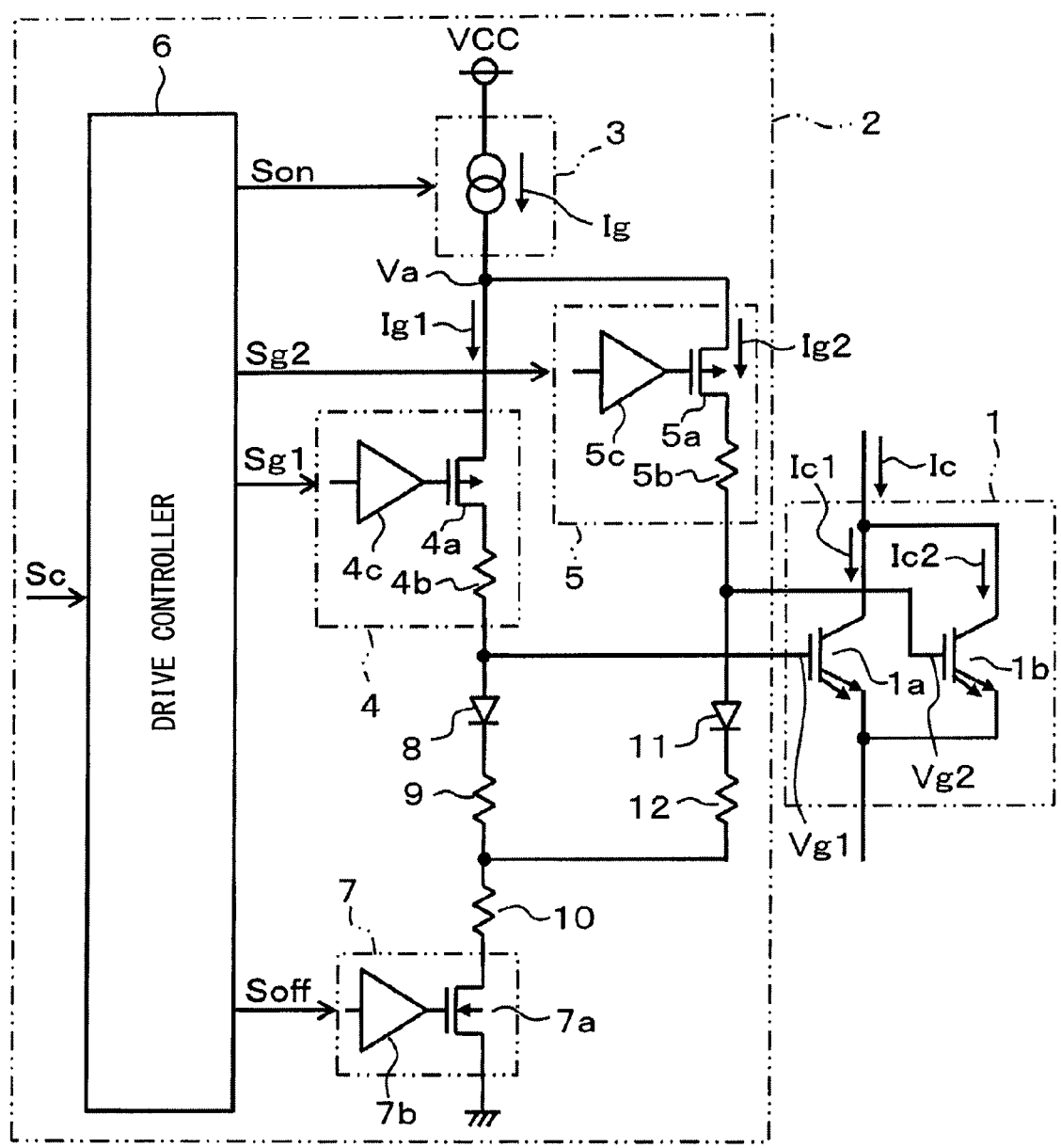
FIG. 1 is an electrical configuration diagram showing a first embodiment.

Some gate drive devices controls driving of multiple gate-driven type semiconductor devices connected in parallel to each other to supply a large current to a load. In such devices, if there is a variation in characteristics of the semiconductor devices, a variation may occur in a current flowing through the semiconductor devices. As a result, in order to supply a necessary current, there is a need to use semiconductor devices having a large current capacity in consideration of variations.

According to a first aspect of the present disclosure, a gate drive device for driving multiple semiconductor devices connected in parallel to each other, includes a constant current circuit that supplies a constant current to respective gates of the semiconductor devices, multiple switching elements respectively provided on multiple paths connecting the constant current circuit and the respective gates of the semiconductor devices, and a drive controller that controls driving of the switching elements to supply the constant current from the constant current circuit to the respective gates of the semiconductor devices.

By employing the above-described configuration, a gate current is supplied from the constant current circuit to the respective gates of the semiconductor devices through the switching elements. Thus, the gate current can be stably supplied as the constant current in response to the variation in gate voltage as compared with a configuration coupled by a resistor, the gate voltage can be appropriately applied to each of the semiconductor devices, and a drive control can be performed so that equal current is supplied to each of the semiconductor devices connected in parallel to each other.

(First Embodiment)

Hereinafter, a first embodiment will be described with reference to FIGS. 1 to 5. A semiconductor device unit 1 is provided as multiple gate-driven type semiconductor devices in which insulated gate bipolar transistors (IGBTs) 1a and 1b of the same sizes are connected in parallel to each other. The IGBTs 1a and 1b are configured to supply a power from a power supply to a load in a state where collectors and emitters of the IGBTs 1a and 1b are commonly connected to each other. Gates of the IGBTs 1a and 1b are supplied with drive signals from a gate drive device 2.

In the gate drive device 2, a constant current circuit 3 is connected to a DC power supply VCC, a gate current Ig1 is supplied to the gate of the IGBT 1a through a drive circuit 4, and a gate current Ig 2 is supplied to the gate of the IGBT 1b through a drive circuit 5.

Figure 2:
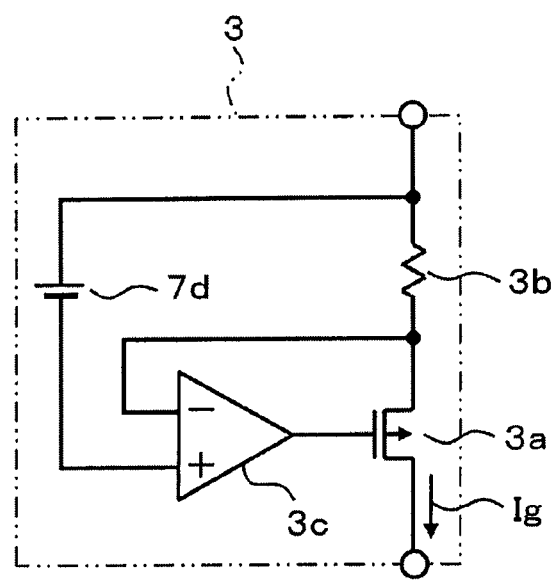
FIG. 2 is an electrical configuration diagram of a constant current circuit.

For example, as shown in FIG. 2, the constant current circuit 3 is configured to supply the DC power supply VCC to a P-channel type MOSFET 3a through a resistor 3b. The MOSFET 3a is supplied with a gate drive signal from a differential amplifier 3c. An inverting input terminal of the differential amplifier 3c is connected to a source of the MOSFET 3a, and a non-inverting input terminal is connected to the DC power supply VCC through a reference power supply 7d.

The differential amplifier 3c drives the MOSFET 3a so that an inter-terminal voltage of the resistor 3b and a reference voltage Vref of the reference power supply 7d become equal to each other. As a result, a constant current Ig set by the reference voltage Vref flows through the MOSFET 3a. The constant current Ig is supplied as the gate currents Ig1 and Ig2 of the IGBTs 1a and 1b. The constant current circuit 3 operates upon receiving a drive signal Son from a drive controller 6.

The drive circuit 4 includes a P-channel type MOSFET 4a and a resistor 4b connected in series with each other, and the MOSFET 4a is supplied with a gate drive signal from a driver 4c. Similarly, the drive circuit 5 includes a P-channel type MOSFET 5a and a resistors 5b connected in series with each other, and the MOSFET 5a is supplied with a gate drive signal from a driver 5c. The drivers 4c and 5c are supplied with drive signals Sg1 and Sg2, respectively, from the drive controller 6.

An off circuit 7 is a circuit for turning off the IGBTs 1a and 1b at the same time, and includes an N-channel MOSFET 7a and a driver 7b for supplying a gate signal. The gate of the IGBT 1a is connected to the MOSFET 7a of the off circuit 7 through a diode 8 and resistors 9 and 10 in series. A gate of the IGBT 1b is connected to the MOSFET 7a of the off circuit 7 through a diode 11 and resistors 12 and 10 in series. The MOSFET 7a discharges a gate charge of the IGBT 1a to the ground by the on operation. The driver 7b is supplied with a drive signal Soff for the off operation from the drive controller 6.

Next, an operation of the above-described configuration will be described with reference to FIGS. 3 to 5. Upon receiving a drive instruction signal Sc of the IGBTs 1a and 1b, the drive controller 6 applies an on signal Son to the constant current circuit 3, and applies the drive signals Sg1 and Sg2 to the drive circuits 4 and 5. As a result, upon turning on the MOSFET 3a, the constant current circuit 3 supplies the constant current Ig set at the reference power supply 7d.

In the drive circuits 4 and 5, the MOSFETs 4a and 5a are fully turned on in response to the drive signals Sg1 and Sg2. In other words, both of the MOSFETs 4a and 5a are operated in saturated regions upon sufficiently receiving the gate voltages. Accordingly, substantially the same gate currents Ig1 and Ig2 can be supplied to the gates of the respective IGBTs 1a and 1b even when the gate voltages differ from each other due to a variation in characteristics. As a result, substantially the same collector currents Ic1 and Ic2 can flow through the two IGBTs 1a and 1b while being shared.

FIG. 3 shows temporal transitions of gate currents, gate voltages, and collector currents of the IGBTs 1a and 1b operated by the control signals Sc in the operation described above. As shown in (a) in FIG. 3, when the drive controller 6 receives the control signal Sc at a low level for instructing driving of the IGBTs 1a and the 1b at a time t1, the drive controller 6 supplies the drive signal Son to the constant current circuit 3 to drive the constant current circuit 3, and thereafter supplies the drive signals Sg1 and Sg2 to the drive circuits 4 and 5 at a time t2. As a result, as shown in (b) in FIG. 3, the constant current Ig supplied from the constant current circuit 3 is branched to the drive circuits 4 and 5 as shown in (c) in FIG. 3, and is supplied to the gates of the IGBTs 1a and 1b as the gate currents Ig1 and Ig2.

In the drive circuits 4 and 5, the MOSFETs 4a and 5a are driven in a full-on state in accordance with the drive signals Sg1 and Sg 2. The respective gates of the IGBTs 1a and 1b are supplied with the gate currents Ig1 and Ig2, respectively, and the IGBTs 1a and 1b are driven by a constant current. In the IGBTs 1a and 1b, when the respective gate voltages Vg1 and Vg2 reach threshold voltages Vt1 and Vt2, the collector currents Ic1 and Ic2 start to flow.

Thereafter, as shown in (d) in FIG. 3, when a mirror period starts from times t3 to t4 by supplying a power to the gates of the IGBTs 1a and 1b, the gate voltages Vg1 and Vg2 are kept constant even upon receiving the gate currents Ig1 and Ig2. At that time, as described above, threshold voltages Vt1 and Vt2 are different from each other and mirror voltages Vmirror1 and Vmirror2 are different from each other due to a variation in characteristics of each of the IGBTs 1a and 1b. Thus, the MOSFETs 4a and 5b of the drive circuits 4 and 5 are different in drain voltage from each other.

However, since the MOSFETs 4a and 5a are fully turned on and driven, the gate currents Ig1 and Ig2 can be set to substantially the same current for a reason to be described later. Accordingly, as shown in (e) in FIG. 3, the IGBTs 1a and 1b can be driven in a state where the collector currents Ic1 and Ic2 are set to substantially the same level.

When the mirror period ends, the gate voltages Vg1 and Vg2 of the IGBTs 1a and 1b start to rise again due to the feeding of the gate currents Ig1 and Ig2, and the gate currents Ig1 and Ig2 become zero when the gate voltages Vg1 and Vg2 reach a predetermined gate voltage at a time t5. In that state, the two IGBTs 1a and 1b are driven by substantially the same collector currents Ic1 and Ic2, and are driven in a state in which the whole current is equally shared.

Thereafter, upon receiving the high level control signal Sc for turning off the IGBTs 1a and 1b at a time t6, the drive controller 6 stops the drive signals Son, Sg1, and Sg2 to be supplied to the constant current circuit 3 and the drive circuits 4 and 5, and stops the application of the voltages to the gates of the IGBTs 1a and 1b. Further, the drive controller 6 outputs the off signal Soff to the off circuit 7 at a time t7. As a result, the MOSFET 7a of the off circuit 7 is turned on to provide a path for discharging charges of the gates of the two IGBTs 1a and 1b. The gate charge of the IGBT 1a is discharged through the diode 8, the resistors 9, 10 and the MOSFET 7a, and the gate charge of the IGBT 1b is discharged through the diode 11, the resistors 12, 10 and the MOSFET 7a. When the gate voltages Vg1 and Vg2 become lower than the threshold voltages Vt1 and Vt2 at a time t8, the collector currents Ic1 and Ic2 also decrease, and the IGBTs 1a and 1b transition to an off state.

Next, a principle by which substantially the same collector currents Ic1 and Ic2 can flow through the two IGBTs 1a and 1b by providing the drive circuits 4 and 5 with the MOSFETs 4a and 5a, respectively, and fully turning on and driving the MOSFETs 4a and 5a will be described with reference to FIGS. 4 and 5.

The characteristics of the MOSFETs 4a and 5a provided in the drive circuits 4 and 5, respectively, in the saturated regions will be described in brief. FIG. 4 shows a relationship between a drain-source voltage Vd and a drain current Id when the MOSFET is driven by a certain gate voltage. In the MOSFET, the drain current Id flowing when the MOSFET receives the gate voltage Vg is expressed by Expression (1) in FIG. 5. In the expressions in FIG. 5, W is a channel width, L is a channel length, Vt is a threshold voltage, $\lambda$ is a channel length modulation coefficient, $\mu$ is a carrier mobility, and Co is a gate oxide film capacity per unit area.

As the drain voltage Vd increases, the drain current Id slightly increases due to the channel length modulation effect. Expression (1) represents a value of the drain current Id in consideration of the channel length modulation coefficient $\lambda$. Expression (1) can be expressed as Expression (2) which depends on the drain voltage Vd when parts other than a term including the drain voltage Vd are replaced by constants as in Expressions (3) and (4) when the gate voltage Vg is constant.

Next, as described above, when the drain voltage Vd is different, the drain current Id also changes, but the amount of change $\Delta$Id becomes relatively small. For example, in FIG. 4, in a case where there is a difference between the drain voltages Vd1 and Vd2, a difference $\Delta$Id between the drain currents Id1 and Id2 can be expressed as Expression (5), and therefore, when Expression (2) is substituted, the difference $\Delta$Id can be expressed as Expression (6) using the drain voltages Vd1 and Vd2.

When a relationship expressed in Expression (6) is applied to a relationship of the MOSFETs 4a and 5a of the drive circuits 4 and 5, the drain currents Id1 and Id2 of the MOSFETs 4a and 5a correspond to the gate currents Ig1 and Ig2 of the IGBTs 1a and 1b in the present embodiment. The drain voltages Vd1 and Vd2 of the MOSFETs 4a and 5a are voltages obtained by subtracting the gate voltages Vg1 and Vd2 of the IGBTs 1a and 1b from the output voltages Va of the constant current circuit 3, respectively.

Accordingly, a variation in the characteristic of the IGBTs 1a and 1b may result in a difference between the gate voltages Vg1 and Vg2 due to a variation between the threshold voltages Vt1 and Vt2, or a variation between the mirror voltages Vmirror1 and Vmirror2 described above. Even in that case, since the MOSFETs 4a and the 5a are operated in a full-on condition, even when a difference occurs between the drain voltages Vd1 and Vd2, a difference ΔId between the drain currents, that is, a difference between the gate current Ig1 of the IGBT 1a and the gate current Ig2 of the IGBT 1b can be restricted from Expression (6).

On the other hand, in a case of driving in a comparative method, the following large error occurs. A case in which the gate is driven with the use of a balance resistor without providing the drive circuits 4 and 5 which operate the MOSFETs 4a and 5a in the full-on state as in the present embodiment will be considered. In that case, when a resistance value of the balance resistor is Rb, a value obtained by dividing a terminal voltage of the balance resistor by the balance resistor becomes the gate current. When the gate voltages of the IGBTs 1a and 1b are the mirror voltages Vmirror1 and Vmirror2, the gate currents Ig1 and Ig2 can be expressed as follows:

$$Ig1=(Va-Vmirror1)/Rb$$

$$Ig2=(Va-Vmirror2)/Rb$$

When the mirror voltages Vmirror1 and Vmirror2 are different depending on the variation in characteristics, the gate currents Ig 1 and Ig 2 have different values according to the above Expressions. In that case, when the resistance value Rb of the balance resistor is set to be large, although ΔIg(=Ig1−Ig2) can be reduced, the gate current is limited. As a result, in the configuration using the balance resistor, it becomes difficult to drive the IGBTs 1a and 1b to separately apply the gate voltages Vg1 and Vg2, and a large error occurs between the collector currents Ic1 and Ic2.

From the above viewpoints, with the application of the configuration according to the present embodiment, as described above, the IGBTs 1a and 1b can be driven while reducing the difference between the gate currents Ig1 and Ig2 caused by a variation in the gate voltages Vg1 and Vg2 of the IGBTs 1a and 1b. Thus, the collector currents Ic1 and Ic2 can be allowed to flow at equal levels.

According to the present embodiment, since the two IGBTs 1a and 1b are connected in parallel to each other to supply a power to a load, the drive circuits 4 and 5 are provided, and the MOSFETs 4a and 5a are fully turned on and driven to supply the gate currents Ig1 and Ig2 of the IGBTs 1a and 1b, even if the IGBTs 1a and 1b have characteristic variations, the collector currents Ic1 and Ic2 can flow equally.

(Second Embodiment)

Figures 5, 6:
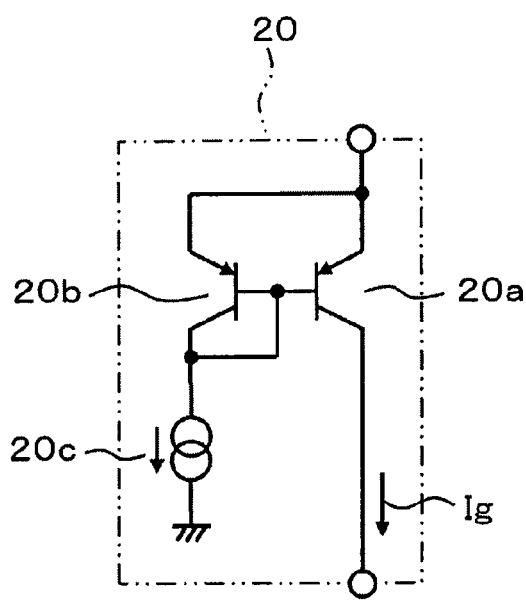
FIG. 5 is a diagram showing mathematical expressions illustrating the operation principle.
FIG. 6 is an electrical configuration diagram of a constant current circuit according to a second embodiment.

FIG. 6 shows a second embodiment, and portions different from the first embodiment will be described below. In the present embodiment, a constant current circuit 20 is provided instead of the constant current circuit 3. As shown in FIG. 6, a pnp-type transistor 20a for allowing a constant current Ig to flow is provided, and a pnp-type transistor 20b is current-mirror connected to a transistor 20a. The transistor 20b is provided so as to cause a predetermined current to flow by the constant current circuit 20c, and causes a current corresponding to a mirror ratio to flow as a constant current Ig. Therefore, the same operation and effects as those of the first embodiment can be obtained by the second embodiment.

(Third Embodiment)

Figure 7:
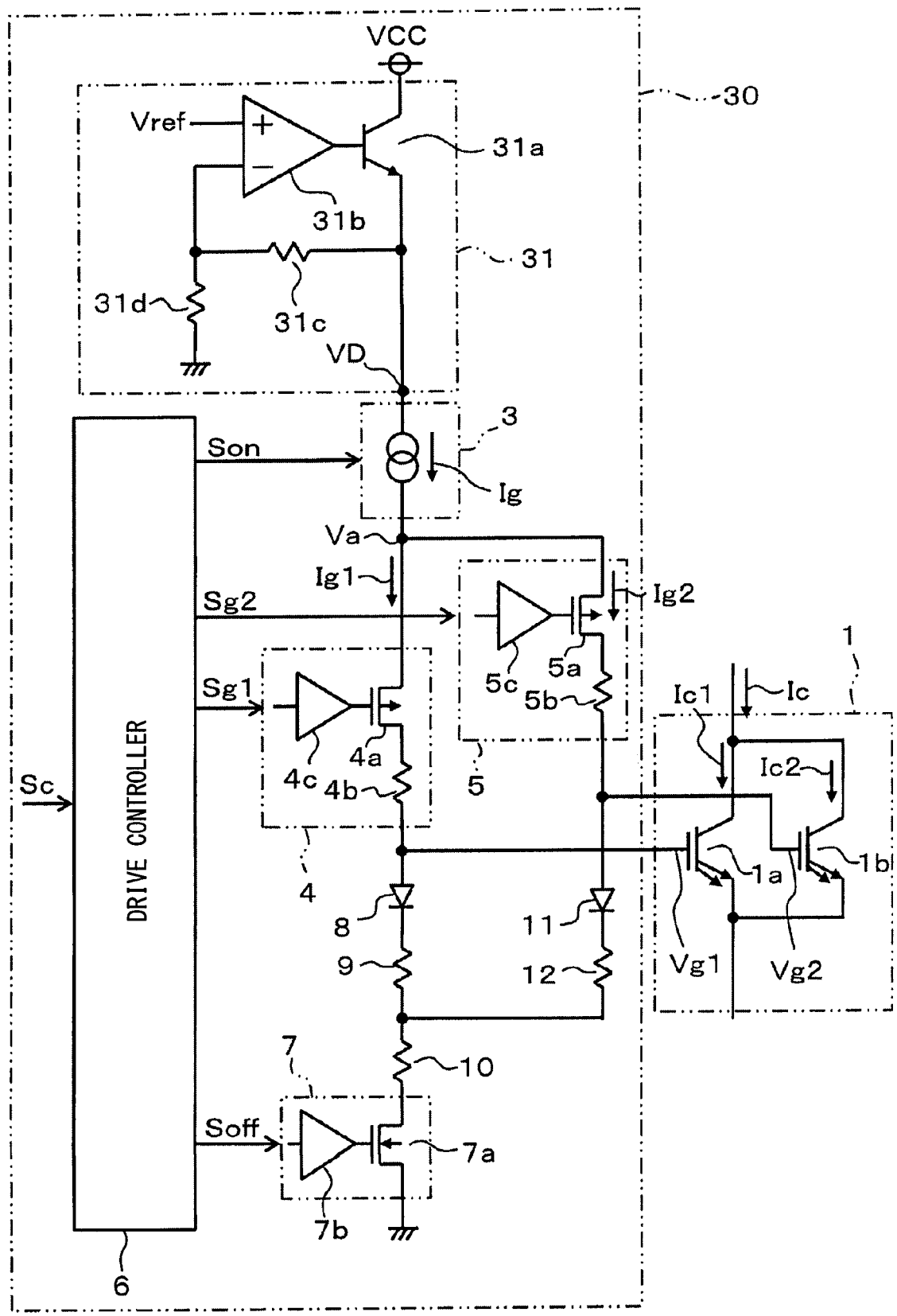
FIG. 7 is an electrical configuration diagram showing a third embodiment.

FIG. 7 shows a third embodiment, and portions different from the first embodiment will be described below. In the present embodiment, a gate drive device 30 has a configuration in which a constant voltage circuit 31 is provided between a DC power supply VCC and a constant current circuit 4.

The constant voltage circuit 31 inhibits a voltage of a DC power supply VCC from fluctuating and supplies a DC voltage VD with high accuracy to a constant current circuit 3. In FIG. 7, a collector-emitter of a pnp-type transistor 31a is connected between the DC power supply VCC and the constant current circuit 3. The base of the transistor 31a is supplied with a base current by a differential amplifier 31b. A non-inverting input terminal of the differential amplifier 31b is supplied with a reference voltage Vref for outputting the output voltage VD. A series circuit of resistors 31c and 31d is connected between the emitter of the transistor 31a and the ground. A common connection point between the resistors 31c and 31d is connected to an inverting input terminal of the differential amplifier 31b.

With the provision of the configuration described above, the base current is supplied to the transistor 31a by the differential amplifier 31b so that the emitter voltage becomes VD, so that the voltage VD can be supplied to the constant current circuit 3 with high accuracy.

According to the third embodiment described above, since the constant voltage circuit 31 is provided, in addition to the advantages of the first embodiment, a variation in the voltage application to the gates of the IGBTs 1a and 1b can be reduced, and more precise drive control can be provided.

(Fourth Embodiment)

Figure 8:
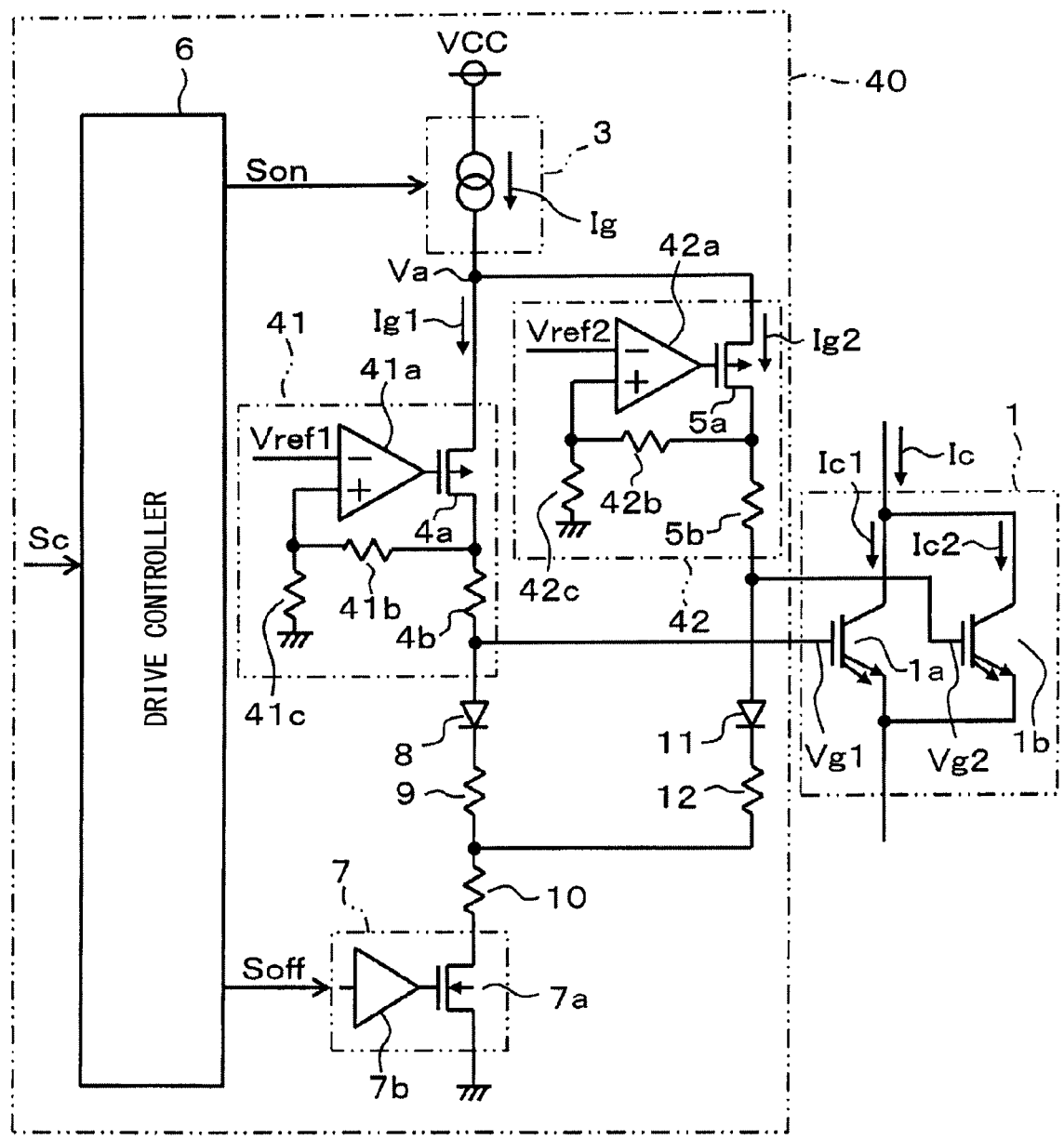
FIG. 8 is an electric configuration diagram showing a fourth embodiment.

FIG. 8 shows a fourth embodiment, and portions different from the first embodiment will be described below. In the present embodiment, a gate drive device 40 includes drive circuits 41 and 42 instead of the drive circuits 4 and 5. The drive circuits 41 and 42 correspond to feedback circuits.

The drive circuit 41 includes a P-channel type MOSFET 4a and a resistor 4b in a path extending from a constant current circuit 3 to a gate of an IGBT 1a. A gate signal is supplied to the MOSFET 4a from a differential amplifier 41a. A reference voltage Vref1 is applied to an inverting input terminal of the differential amplifier 41a. A voltage divider circuit of resistors 41b and 41c are connected between a drain of the MOSFET 4a and the ground, and a common connection point of the resistors 41b and 41c is connected to a non-inverting input terminal of the differential amplifier 41a.

In the same manner, the drive circuit 42 includes a P-channel type MOSFET 5a and a resistor 5b in a path extending from the constant current circuit 3 to a gate of an IGBT 1b. A gate signal is supplied from a differential amplifier 51a to the MOSFET 5a. A reference voltage Vref2 is applied to an inverting input terminal of the differential amplifier 51a. A voltage divider circuit of resistors 42b and 42c is connected between a drain of the MOSFET 5a and the ground, and a common connection point of the resistors 42b and 42c is connected to a non-inverting input terminal of the differential amplifier 42a.

With the configuration described above, the drive circuits 41 and 42 can perform a feedback control with the differential amplifiers 41a and 42a while monitoring drain voltages of the MOSFETs 4a and 5a by the voltage divider circuits. As a result, the MOSFETs 4a and 5a can be fully turned on with high accuracy. According to the fourth embodiment described above, the same advantages as those of the first embodiment can be obtained.

(Fifth Embodiment)

Figure 9:
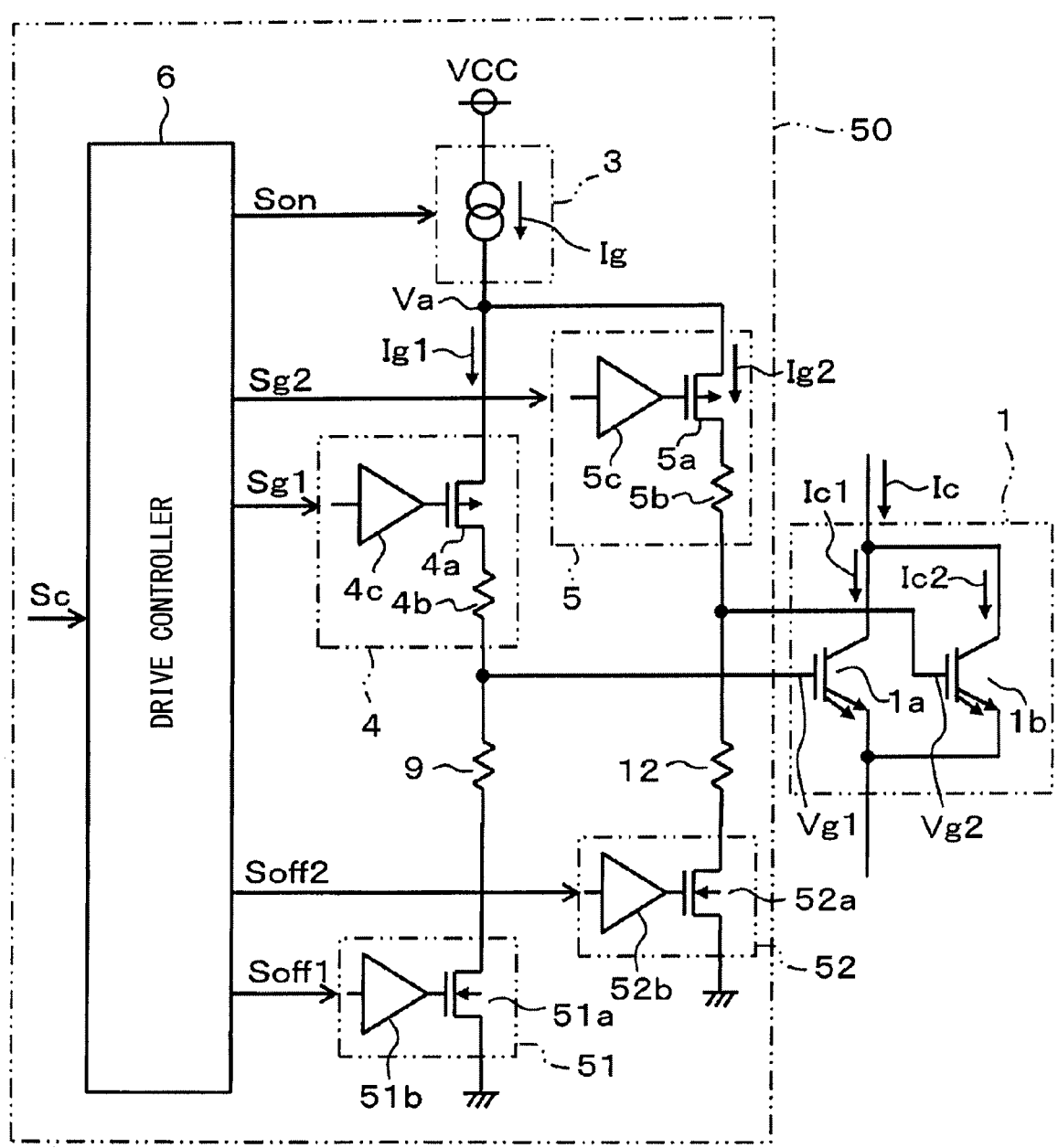
FIG. 9 is an electric configuration diagram showing a fifth embodiment.

FIG. 9 shows a fifth embodiment, and portions different from the first embodiment will be described below. In the present embodiment, a gate drive device 50 includes off circuits 51 and 52 for individually turning off IGBTs 1a and 1b instead of the off circuit 7.

The off circuit 51 includes an N-channel type MOSFET 51a, and a driver 51b that gives a gate signal. Similarly, the off circuit 52 includes an N-channel type MOSFET 52a, and a driver 52b that gives a gate signal. Further, the diodes 8 and 11 and the resistor 10 provided in the first embodiment are not provided.

With the employment of the configuration described above, the on-off operation of the IGBTs 1a and 1b can be controlled individually. Also in the present embodiment, the same operation and effects as in the first embodiment can be obtained.

(Sixth Embodiment)

Figure 10:
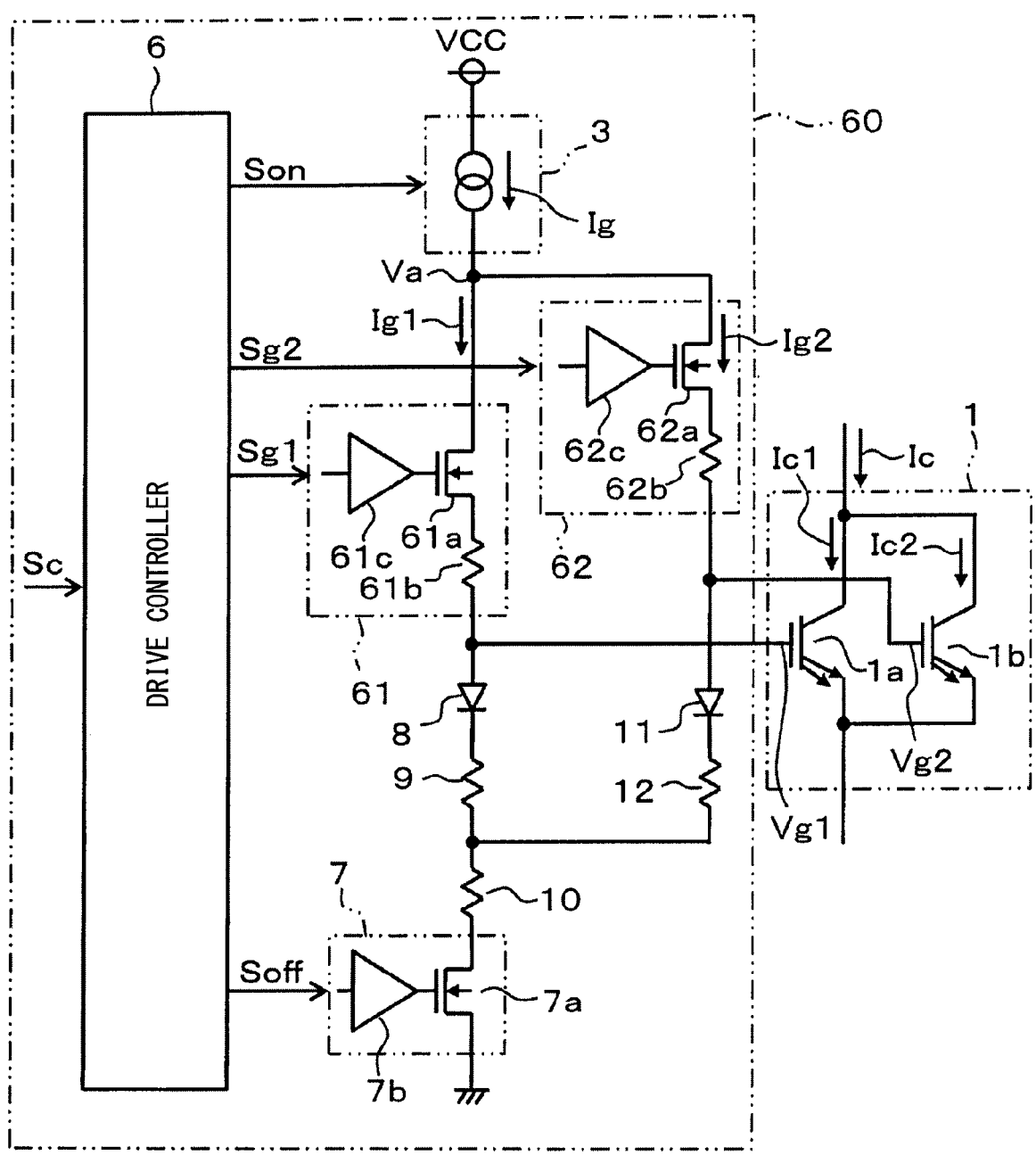
FIG. 10 is an electric configuration diagram showing a sixth embodiment.

FIG. 10 shows a sixth embodiment, and portions different from the first embodiment will be described below. In the present embodiment, a gate drive device 60 is configured to provide drive circuits 61 and 62 instead of the drive circuits 4 and 5.

The drive circuit 61 is configured to connect an N-channel type MOSFET 61a and a resistor 61b in series, and the MOSFET 61a is supplied with a gate drive signal from a driver 61c. Similarly, the drive circuit 62 is configured to connect an N-channel type MOSFET 62a and a resistor 62b in series, and the MOSFET 62a is supplied with a gate drive signal from a driver 62c. The drivers 61c and 62c are supplied with drive signals Sg1 and Sg2, respectively, from a drive controller 6.

In the present embodiment, N-channel type MOSFETs 61a and 62a are provided in the drive circuits 61 and 62, respectively, as switching elements for driving gates. In the driving of the gates of the IGBTs 1a and 1b, high-side driving is performed so that the MOSFETs 61a and 62a are fully turned on by the drivers 61c and 62c, respectively. Therefore, the same operation and effects as those of the first embodiment can be obtained by the sixth embodiment.

(Seventh Embodiment)

Figure 11:
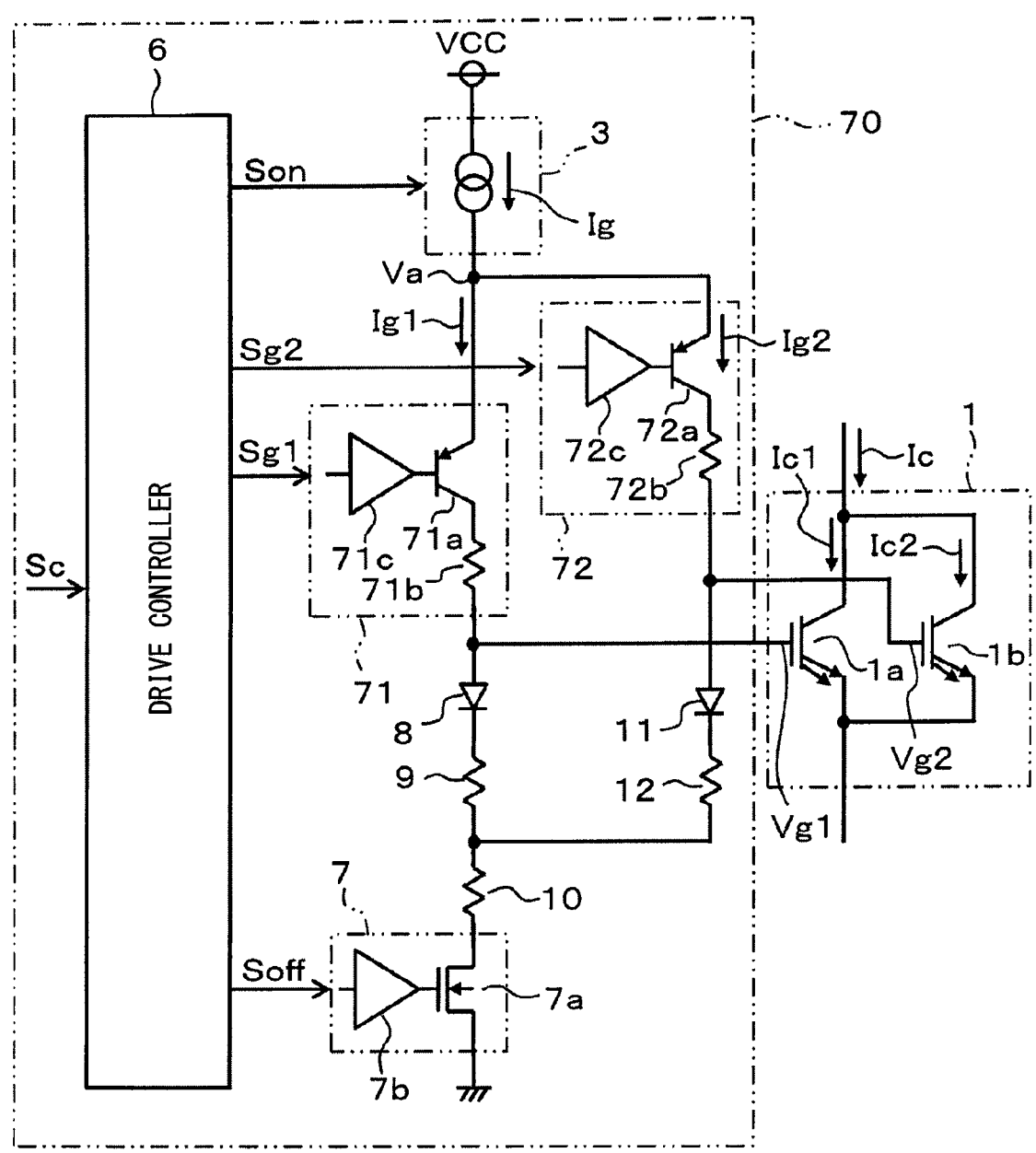
FIG. 11 is an electric configuration diagram showing a seventh embodiment.

FIG. 11 shows a seventh embodiment, and portions different from the first embodiment will be described below. In the present embodiment, a gate drive device 70 includes drive circuits 71 and 72 instead of the drive circuits 4 and 5.

The drive circuit 71 includes a pnp-type bipolar transistor 71a and a resistor 71b connected in series, and a base current is supplied to a transistor 71a from a driver 71c. Similarly, the drive circuit 72 includes a pnp-type bipolar transistor 72a and a resistor 72b connected in series, and the transistor 72a is supplied with a base current from a driver 72c. The drivers 71c and 72c are supplied with drive signals Sg1 and Sg2, respectively, from a drive controller 6.

When a base current is supplied from the drivers 71c and 72c, the driving of the transistors 71a and 72a of the drive circuits 71 and 72 is controlled so as to operate in a saturated region. As a result, the switching elements are controlled to a full-on state. Therefore, the same operation and effects as those of the first embodiment can be obtained by the seventh embodiment.

(Other Embodiments)

It is to be noted that the present disclosure is not limited to the embodiments described above, and can be applied to various embodiments without departing from the spirit of the present disclosure, and can be modified or expanded, for example, as follows.

The gate-driven type semiconductor device is not limited to the IGBTs 1a and 1b semiconductor device 1b, and the gate-driven type semiconductor device may have a structure in which three or more IGBT elements are provided. In addition, the gate-driven semiconductor device can be applied to a MOSFET other than the IGBT.

As the switching element, an npn-type bipolar transistor can be used in addition to the P-channel MOSFET, the N-channel MOSFET, and the pnp-type bipolar transistor, or another switching element can be used.

The configuration in which the off circuits are individually provided as in the fifth embodiment can be applied to the first to fourth embodiments or the sixth and seventh embodiments.

Although the disclosure has been described in accordance with the examples, it is understood that the present disclosure is not limited to the above examples or structures. The present disclosure encompasses various modifications and variations within the scope of equivalents. In addition, various combinations and configurations, as well as other combinations and configurations that include only one element, more, or less, fall within the scope and spirit of the present disclosure.

The invention claimed is:

1. A gate drive device for driving a plurality of semiconductor devices connected in parallel to each other, comprising:
    a constant current circuit that supplies a constant current to respective gates of the plurality of semiconductor devices;
    a plurality of switching elements that is respectively provided on a plurality of paths connecting the constant current circuit and the respective gates of the plurality of semiconductor devices; and
    a drive controller that controls driving of the plurality of switching elements to supply the constant current from the constant current circuit to the respective gates of the plurality of semiconductor devices, wherein
    the drive controller operates each of the plurality of switching elements in a saturated region when driving the plurality of semiconductor devices.

2. The gate drive device according to claim 1, further comprising
    a plurality of feedback circuits that is provided for the plurality of switching elements, respectively, and supplies a constant voltage to the respective gates of the plurality of semiconductor devices.

3. The gate drive device according to claim 1, further comprising
    a constant voltage circuit that supplies a constant voltage to the constant current circuit.

4. The gate drive device according to claim 1, wherein each of the plurality of switching elements is a P-channel type MOSFET.

5. The gate drive device according to claim 1, wherein each of the plurality of switching elements is an N-channel type MOSFET.

6. The gate drive device according to claim 1, wherein
the plurality of semiconductor devices is a plurality of
   insulated gate bipolar transistors (IGBTs) each having
   a collector and an emitter or a plurality of metal-oxide
   semiconductor field-effect transistors (MOSFETs) each
   having a drain and a source,
in a case where the plurality of semiconductor devices is
   the plurality of IGBTs, the collectors of the plurality of
   IGBTs are commonly connected, and the emitters of the
   plurality of IGBTs are commonly connected, and
in a case where the plurality of semiconductor devices is
   the plurality of MOSFETs, the drains of the plurality of
   MOSFETs are commonly connected, and the sources of
   the plurality of MOSFETs are commonly connected.

* * * * *